United States Patent [19]
Ikemasu et al.

[11] Patent Number: 5,580,812
[45] Date of Patent: Dec. 3, 1996

[54] SEMICONDUCTOR DEVICE HAVE A BELT COVER FILM

[75] Inventors: Shinichirou Ikemasu; Yoshiki Hasegawa; Yasuhiko Konno, all of Kawasaki, Japan

[73] Assignee: Fujitsu Limited, Kanagawa, Japan

[21] Appl. No.: 451,216

[22] Filed: May 26, 1995

Related U.S. Application Data

[62] Division of Ser. No. 293,209, Aug. 19, 1994, Pat. No. 5,502,332, which is a continuation of Ser. No. 948,033, Sep. 21, 1992, abandoned.

[30] Foreign Application Priority Data

Sep. 19, 1991 [JP] Japan .................. 3-239364

[51] Int. Cl.⁶ .............................. H01L 21/8242
[52] U.S. Cl. .................. 437/52; 437/60; 437/228
[58] Field of Search ....................... 437/47, 48, 52, 437/60, 228, 235, 919; 257/620

[56] References Cited

U.S. PATENT DOCUMENTS

| | | |
|---|---|---|
| 4,364,078 | 12/1982 | Smith et al. . |
| 4,967,259 | 10/1990 | Takagi . |
| 5,136,354 | 8/1992 | Morita et al. . |
| 5,158,905 | 10/1992 | Ahm ............................ 437/52 |
| 5,160,987 | 11/1992 | Pricer et al. . |
| 5,164,337 | 11/1992 | Ogawa et al. ............ 437/52 |
| 5,206,787 | 4/1993 | Fujioka ...................... 437/52 |
| 5,374,577 | 12/1994 | Tuan ........................... 437/52 |

FOREIGN PATENT DOCUMENTS

| | | |
|---|---|---|
| 0318227 | 5/1989 | European Pat. Off. . |
| 58-17621 | 2/1983 | Japan . |
| 60-18945 | 1/1985 | Japan . |
| 62-76639 | 4/1987 | Japan . |
| 1-122114 | 5/1989 | Japan . |
| 1-154552 | 6/1989 | Japan . |
| 3-138920 | 6/1991 | Japan . |

OTHER PUBLICATIONS

Novel Stacked Capacitor Cell For 64Mb DRAM, W. Wakamiya et al.

3mm² Crown–shaped STC Cell for 64M–Bit DRAMS, Kaga et al.

*Primary Examiner*—Tom Thomas
*Attorney, Agent, or Firm*—Nikaido Marmelstein Murray & Oram LLP

[57] ABSTRACT

The conductive material film, e.g. a polysilicon film, is anisotropically etched for forming a pattern, e.g. a storage electrode, and a base insulating film, e.g. an insulating film made of $SiO_2$, is isotropically etched for exposing the sidewall or backside of the conductive material film during a manufacturing process of the semiconductor element, e.g. a memory cell including a transistor and a capacitor. A belt cover film, including the conductive material film, is formed to cover the surrounding and vicinity of a chip in which the semiconductor element is formed, at the same time when the conductive material film is formed.

7 Claims, 14 Drawing Sheets

SEMICONDUCTOR DEVICE HAVE A BELT COVER FILM

This is a divisional of application Ser. No. 08/293,209 filed Aug. 19, 1994, now U.S. Pat. No. 5,502,332 which is a continuation application of application Ser. No. 07/948,033 filed on Sep. 21, 1992, now abandoned.

BACKGROUND OF THE INVENTION

1. Field of the Invention

This invention pertains to an improvement in a semiconductor memory device, such as a DRAM (dynamic random access memory), SRAM (static random access memory), EEPROM (electric erasable and programmable read only memory) and other semiconductor devices requiring sufficient storage capacitance such as an analog IC with capacitance.

2. Background of the Invention

DRAM has become more and more minuscule in recent years. Thus, the area occupied by a single memory cell has decreased. To obtain a stable DRAM relative to soft errors, a storage capacitance of a sufficient value must be formed in this tiny area. Accordingly, various three dimensional memories, e.g. a stacked type of memory, a trenched type of memory, a crown type of memory, and a cylinder type of memory, have been put into use. Yet, a number of problems still remain to be solved to form memories having such structures.

DESCRIPTION OF THE RELATED ARTS

A DRAM represents a semiconductor device that requires a memory capacitance. Generally, it is said to be desirable for DRAM with a memory capacity above 16 M bits to have a fin structure, which is a kind of stacked type.

FIG. 1 is a side view showing a cutaway of a pertinent part for explaining a DRAM having a single layer fin structure storage capacitor.

In FIG. 1, 1 is a p-type silicon semiconductor board, 2 is a field insulation film made of $SiO_2$, 3 is a gate insulation film made of $SiO_2$, 4 is a gate electrode (word line) made of polycide (a dual layer structure comprising a refractory metal silicide layer and a polysilicon layer), 5 is an n-type source region, 6 is an n-type drain region, 7 is an interlayer insulation film made of $SiO_2$, 8 is a bit line made of polycide, 9 is an etching protection film made of $Si_3N_4$, 10 is an insulating film made of $SiO_2$, (see FIG. 6) 11 is a storage electrode made of polysilicon, 12 is the first fin made of polysilicon for the storage electrode 11, 13 is a capacitive dielectric film, and 14 is a counter electrode (also called a cell plate) made of polysilicon.

FIG. 2 is a side view showing a cutaway of a pertinent part for explaining a DRAM having a dual layer fin structure storage capacitor.

In FIG. 2, parts that are the same as those shown in FIG. 1 have the same numbers. And 15 is the second fin made of polysilicon for the storage electrode 11.

FIGS. 3 through 10 are side views of pertinent parts for explaining prior art manufacturing processes.

FIGS. 11 through 16 are plan views of pertinent parts for explaining prior art manufacturing processes.

More specifically, FIGS. 3 through 10 show cutaways along the Z—Z line shown in FIG. 11.

The following explanations refer to FIGS. 3 through 16, where parts that are the same as those shown in FIGS. 1 and 2 have the same numbers. Also, for simplicity, FIGS. 11 through 16 do not show insulation films but instead show only contact holes.

In FIGS. 3 and 11:
Step 3/11-1:
By applying a selective heat oxidization method for making into an oxidization-resistant film an $Si_3N_4$ film is formed on top of an extremely thin $SiO_2$ film, and a field insulation film 2 made of $SiO_2$ film e.g. having a thickness of four hundred nanometers [400 nm] is formed on a p-type silicon semiconductor board 1.
Step 3/11-2:
By eliminating the Si3N4 film and other material used as the oxidization-resistant mask, an active region is exposed. In FIG. 11, for convenience, the active region is designated by a p-type silicon semiconductor board 1.
Step 3/11-3:
By applying a heat oxidization method to oxidize an entire surface of a wafer, a gate insulation film 3 made of $SiO_2$ e.g. having a thickness of fifteen nanometers [15 nm] covering the active region is formed.
Step 3/11-4:
By applying a chemical vapor deposition (CVD) method, a polysilicon film e.g. having a thickness of one hundred nanometers [100 nm] and a tungsten-silicide (WSi) film e.g. having a thickness of one hundred nanometers [100 nm] are formed in sequence.
Step 3/11-5:
By applying a photo resist process of a lithography technique and a reactive ion etching (RIE) method using $CCl_4$ as an etching gas for a tungsten-silicide (WSi) film, and $Br_2$ or HBr as an etching gas for a polysilicon film, a pattern is formed on the tungsten-silicide (WSi) film and the polysilicon film, which are created in step 3/11-4, thereby forming a gate electrode 4, which is a word line.
Step 3/11-6:
By applying an ion implantation method, with a dosage set e.g. at $5 \times 10^{13}$ $[cm^{-2}]$, phosphorus (P) ions are implanted with ion acceleration energy at forty electron volts [40 keV], thereby forming an n-type source region 5 and an n-type drain region 6.

In FIGS. 4 and 12:
Step 4/12-1:
By applying a CVD method, an interlayer insulation film 7 made of $SiO_2$ e.g. having a thickness of one hundred and fifty nanometers [150 nm] is formed.
Step 4/12-2:
By applying a resist process of a lithography technique and an RIE method using $CHF_3$ or $CF_4$ as an etching gas, the interlayer insulation film 7 and the gate insulation film 3 are selectively etched for forming a bit line contact hole 7A, within which a part of the n-type source region 5 is exposed.

In FIGS. 5 and 13:
Step 5/13-1:
By applying a CVD method, a polysilicon film e.g. having a thickness of one hundred nanometers [100 nm]and a tungsten-silicide film e.g. having a thickness of two hundred nanometers [200 nm] are formed in sequence.
Step 5/13-2:
By applying a resist process for a lithography technique and an RIE method using $CCl_4$ as an etching gas for a tungsten-silicide (WSi) film, and $Br_2$ or HBr as an etching gas for a polysilicon film, a pattern is formed on the tungsten-silicide (WSi) film and the polysilicon film, which are created in step 5/13-1, thereby forming the bit line 8.

In FIG. 6:
Step 6-1:
By applying a CVD method, an etching protection film 9 made of $Si_3N_4$ e.g. having a thickness of one hundred nanometers [100 nm] and an insulating film 10 made of $SiO_2$ e.g. having a thickness of fifty nanometers [50 nm] are formed in sequence.

In FIGS. 7 and 14:
Step 7/14-1:
By applying a resist process of a lithography technique and an RIE method using $CHF_3$ or $CF_4$ as an etching gas, a storage electrode contact hole 10A is formed, within which a part of the n-type drain region 6 is exposed. The storage electrode contact hole 10A penetrates the insulating film 10, the etching protection film 9, the interlayer insulation film 7 and the gate insulation film 3.

In FIGS. 8 and 15:
Step 8/15-1:
By applying a CVD method, a polysilicon film, e.g. having a thickness of one hundred nanometers [100 nm], is formed.
Step 8/15-2:
By applying a resist process of a lithography technique and an RIE method using $Br_2$ or HBr as an etching gas for a polysilicon film, a pattern is formed on the polysilicon film, which is created in step 8/15-1, thereby forming the storage electrode 11, which has the first fin 12 as its integral part.

In FIGS. 9 and 15:
Step 9/15-1:
By applying a wet etching method using an HF-based solvent used as etchant, the insulating film 10 made of $SiO_2$ is etched isotropically, such that the insulating film 10 under the first fin 12 of the memory electrode 11 is completely eliminated. case, because the etching protection film 9 made of $Si_3N_4$ exists for protecting the layer under the insulating film when an etching is performed using HF, the duration of the etching need not be precisely controlled.

In FIGS. 10 and 16:
Step 10/16-1:
By applying a CVD method, a capacitive dielectric film 13, comprising a capacitive dielectric layer made of $Si_3N_4$ formed by CVD and having a thickness of six nanometers [6 nm], for example, and another capacitive dielectric layer made of $SiO_2$ formed by a thermal oxidation and having a thickness of one nanometer [1 nm], for example, is formed.
Step 10/16-2:
By applying a CVD method, a counter electrode 14 made of polysilicon e.g. having a thickness of one hundred and fifty nanometers [150 nm] is formed. The counter electrode 14 is also called a cell plate.
Step 10/16-3:
By applying a conventional technique art, another interlayer insulation film 7, an electrode, a wiring, etc. are formed, thereby completing a DRAM.

Because the DRAM thus completed has a fin structure storage capacitor, even if the area occupied by the memory cell is small, a sufficient volume of electric charge can be stored, thereby enabling stable exchange of data by reading or writing.

As is evident from the earlier description, a memory cell having a fin structure storage capacitor, e.g. a DRAM shown in FIG. 1, forms a storage electrode 11 comprising a first fin 12 formed on a prefabricated insulating film, then by eliminating the insulating film 10, the backside of the storage electrode 11 is exposed, thereby forming the capacitive dielectric film 13 and the counter electrode 14 on the backside of the storage electrode 11, thus increasing the storage capacitance, in order to effectively utilize all sides of the storage electrode 11, i.e. even the backside of the first fin 12 as a part of the surface of the storage electrode 11.

As such, a step of eliminating the spacer 10 by an isotropically etching is necessary in obtaining a memory cell having a fin structure storage capacitor. However, a new problem arising at the periphery portion of the end of a chip formed on a wafer accompanies this step.

The end of a chip refers to a vicinity on the border between the chip and its scribe region. Namely, as described above, the scribe region (or dicing region) for cutting out a chip from a wafer is provided in the vicinity of the chip on the wafer. An alignment mark for a stepper, which is used for an alignment with a reticle (enlarged dimension mask) of an element pattern region of each chip during a photolithography process, or a pattern for various examinations, is formed for the scribe region in the previous process. When an etching is performed to form a contact hole, for example, a detection of an end point of the etching is determined based on a variation of an atmosphere gas component in an etching chamber and thus the sensitivity in detecting the end point of the etching increases with the etching area. The etching of only the contact hole can not achieve a sufficient detection sensitivity. Therefore a region other than the region in which the chip is formed on the wafer, such as the scribe region, is etched in order to increase the detection sensitivity.

The scribe region 23 will be shown in FIGS. 17 and 18.

FIG. 17 shows a plan view of a pertinent part of a wafer with a chip formed in it.

FIG. 18 shows a magnified cutaway of the pertinent part circled in dashed lines in FIG. 17.

Parts shown in FIGS. 17 and 18 that are essentially the same as those shown in FIGS. 3 through 16 have the same numbers.

In FIGS. 17 and 18, 21 is a wafer, 22 is a chip, and 23 is a scribe region.

A new problem arising at the periphery of a chip such as a scribe region 23 is explained below.

FIGS. 19 through 24 show cutaways of a pertinent part of a DRAM illustrating how it changes during the conventional manufacturing steps.

More specifically, steps shown in FIGS. 19 through 24 correspond respectively to those shown in FIGS. 4 through 9. The part of concern is the scribe region 23 formed in tile vicinity of the chip.

In FIG. 19 (corresponding to FIG. 4):
Step 19-1:
By applying a CVD method, the interlayer insulation film 7 of $SiO_2$ is formed e.g. having a thickness of one hundred and fifty nanometers [150 nm].
Step 19-2:
By applying a resist process of a lithography technique and an RIE method using $CHF_3$ or $CF_4$ an etching gas, the interlayer insulation film 7 and the gate insulation film 3 are selectively etched for forming a bit line contact hole 7A, within which a part of the n-type source region 5 is exposed. Then, an aperture 7B is formed in the scribe region 23 in the vicinity of the chip.

The aperture 7B is formed for detecting an end point of an etching. That is, the etching end point is detected by a change in an environmental gas composition in an etching chamber. Thus, the larger an etching area is, the more sensitive the detection. Because the interlayer insulation film 7 left in the scribe region 23 only makes a scribe more difficult and produces no benefit, it is common and desirable to eliminate it. This is also desirable to increase the sensitivity in detecting an end point of an etching.

In FIG. 20 (corresponding to FIG. 5):
Step 20-1:
By applying a CVD method, a polysilicon film e.g. having a thickness of one hundred nanometers [100 nm] and a tungsten-silicide film e.g. having a thickness of two hundred nanometers [200 nm] are formed in sequence.
Step 20-2:
By applying a resist process for a lithography technique and an RIE method using $CCl_4$ as an etching gas for a tungsten-silicide (WSi) film, and $Br_2$ or HBr as an etching gas for a polysilicon film, a pattern is formed on the tungsten-silicide (WSi) film and the polysilicon film, which are created in step 20-1, thereby forming the bit line 8. However, because the scriber region 23 does not have an etching stopper such as the interlayer insulating film 7, the p-type silicon semiconductor board 1 is etched, thereby creating a kink 1A.

In FIG. 21 (corresponding to FIG. 6):
Step 21-1:
By applying a CVD method, an etching protection film 9 made of $Si_3N_4$ e.g. having a thickness of one hundred nanometers [100 nm] and an insulating film 10 made of $SiO_2$ e.g. having a thickness of fifty nanometers [50 nm] are formed in sequence.

In FIG. 22 (corresponding to FIG. 7):
Step 22-1:
By applying a resist process of a lithography technique and an RIE method using $CHF_3$ or $CF_4$ as an etching gas, a storage electrode contact hole 10A is formed, within which a part of the n-type drain region 6 is exposed. The storage electrode contact hole 10A penetrates the insulating film 10, the etching protection film 9, the interlayer insulation film 7 and the gate insulation film 3. Then, an aperture 10B is formed in the scribe region 23 at the end of the chip.

The aperture 10B thus formed is used for detecting an etching end point. That is, the etching end point is detected by a change in the environmental gas composition in an etching chamber. Thus, the larger an etching area, the more sensitive the detection is. Because the interlayer insulation film 7 left in the scribe region 23 only makes a scribe more difficult and produces no benefit, it is common and desirable to eliminate it.

In FIG. 23 (corresponding to FIG. 8):
Step 23-1:
By applying a CVD method, a polysilicon film, e.g. having a thickness of one hundred nanometers [100 nm], is formed.
Step 23-2:
By applying a resist process of a lithography technique and an RIE method using $Br_2$ as an etching gas for polysilicon, a pattern is formed on the polysilicon film, which is created in step 23-1, thereby forming the memory electrode 11, which has the first fin 12 as its integral part. However, because the scriber region 23 does not have an etching stopper, the p-type silicon semiconductor board 1 is etched, thereby creating a kink 1B. The kinks 1A and 1B form a residue 11A made of polysilicon.

The residue 11A is inevitably formed, because the polysilicon film formed in step 23-1 is made into the storage electrode 11 having the first fin 12 by an anisotropic etching.

In FIG. 24 (corresponding to FIG. 9):
Step 24-1:
By applying a wet etching method using an HF-based solvent as an etchant, the insulating film 10 made of $SiO_2$ is etched isotropically, such that the insulating film 10 under the first fin 12 of the storage electrode 11 is completely eliminated. In this case, the residue 11A especially arising from kink 1A is lifted off from the scribe region 23.

As is evident from the earlier description, the residue 11A lifted off from the scribe region 23 drifts around the chip. However, its attachment to a chip causes at least a few memory cells to malfunction. In a worst case, its attachment to the chip makes the entire DRAM of the chip worthless.

Such a danger is not limited to a semiconductor device or a structure on which a plurality of a DRAM chips are formed, but instead, it is a problem incidental to any semiconductor device having a storage capacitance.

An example of such a semiconductor device is one kind of cylinder type memory cell, the "NOVEL STACKED CAPACITOR CELL" published by Mitsubishi Electric Corporation in pages 69–70 of "DIGEST OF TECHNICAL PAPERS" in "SYMPOSIUM ON VLSI TECHNOLOGY" held in 1989. Another example of such a semiconductor memory cell is the "CROWN-SHAPE STACKED CAPACITOR CELL" published by the Hitachi Limited and the Hitachi VLSI Engineering in pages twenty-one [21]through thirty-five [35] of electronic technology research report "silicon material device" Vol. 90, No. 47, SDM90-14 1990.

SUMMARY OF THE INVENTION

This invention aims at improving the yield in manufacturing a semiconductor memory device having a storage capacitor. It uses an extremely simple method to restrict a residue of a storage electrode material produced in the vicinity of a chip, such as the scribe region from freely drifting from the scribe region.

According to the feature of the present invention, a semiconductor element is manufactured, such that a conductive material film (e.g. a polysilicon film) is etched anisotropically to form a pattern ( e.g. the storage electrode ) and a base insulating film (e.g. the insulating film made of $SiO_2$) formed under the conductive material film is etched isotropically, thereby exposing the backside of the conductive material film. A belt cover film formed by using a part of the patterned conductive material film has a width sufficient to cover the surroundings and vicinity (a part of the scribe region of a chip in which the semiconductor element such as a memory cell comprising a transistor and a capacitor is built. ) The conductive material film comprises a polysilicon film, for example, and a part of the conductive material film patterned by an anisotropical etching forms a storage electrode in a storage capacitor included in the semiconductor element. Further, the conductive material film comprises a polysilicon film and a part of the conductive material film patterned by an anisotropical etching forms a fin structure storage electrode in a storage capacitor of a memory cell comprising a transistor and a capacitor.

According to another feature of the present invention, a semiconductor element is manufactured such that after a storage electrode of a capacitor is formed on an insulator film, the insulator film is eliminated by an i so tropical etching and the vicinity and periphery of the chip within which the capacitor is formed is covered by the same conductive material film as the material of the storage electrode. The conductive material film is formed in the vicinity and periphery of the chip in the step of patterning the storage electrode. The storage electrode may be formed as a memory cell with a crown type capacitor structure such as a crown-shape stacked capacitor cell or a memory cell with a cylinder type capacitor structure such as a novel stacked capacitor cell.

BRIEF DESCRIPTION OF THE DRAWINGS

One skilled in the art can easily understand additional features and objects of this invention from the description of the preferred embodiments and some of the attached drawings. In the drawings.

DESCRIPTION OF THE PREFERRED EMBODIMENT

Overview of the Underlying Principles

Before going into the detailed explanation of the preferred embodiments, the underlying principles of this invention are discussed first.

Figure 25:
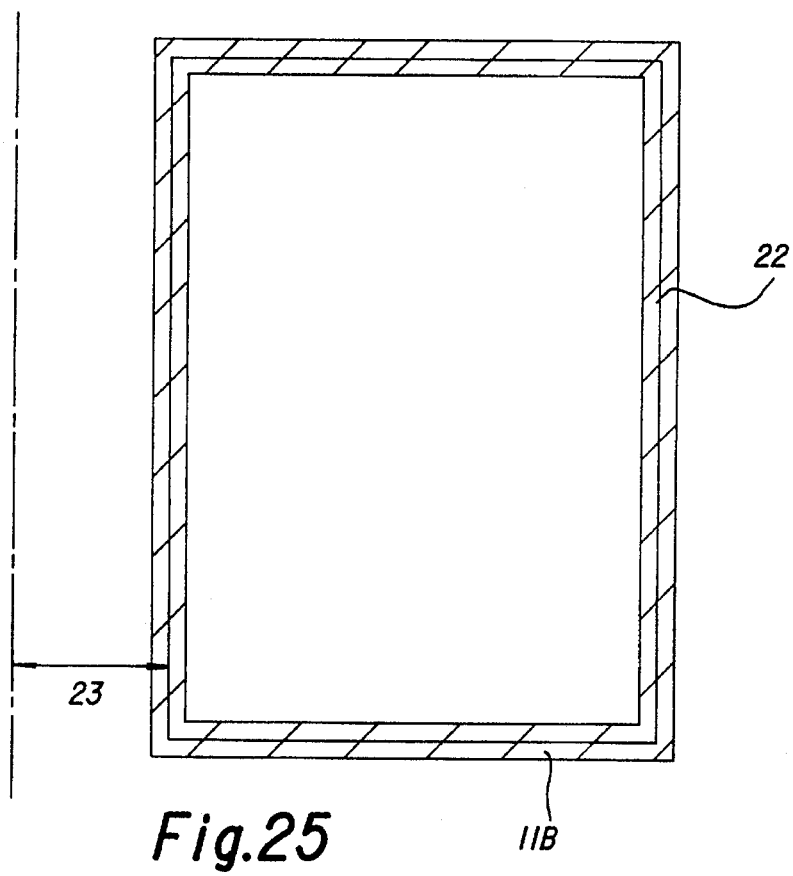
FIG. 25 is a plan view of a DRAM in a pertinent manufacturing step for illustrating the principles underlying this invention.

FIG. 25 is a plan view of a DRAM chip in a pertinent manufacturing step for illustrating the principles underlying this invention.

Parts shown in FIG. 25 that are the same as those shown in FIGS. 1 through 24 have the same numbers.

This invention has a belt cover film 11B created for covering a periphery of the chip 22 and a part of the scribe region 23 by using a conductive material film for use in forming the memory electrode 11. (Refer to FIGS. 1 and 2.) In doing so, a conductive material film for covering a memory electrode is formed, which is kept on the belt cover film 11B by reconfiguring a mask pattern partly different from the mask pattern used in prior art, when it is patterned into a memory electrode 11 having a fin.

Thus, a semiconductor device pursuant to this invention is characterized by one [1] of three [3] forms (1), (2) and (3).

Form (1):

A semiconductor element is manufactured, such that a conductive material film (e.g. a polysilicon film) is etched anisotropically to form a pattern (e.g. the memory electrode 11) and a base insulating film (e.g. the insulating film 10 made of $SiO_2$) is etched isotropically, thereby exposing the backside of the conductive material film. A belt cover film (e.g. the belt cover film 11B) formed by using a part of the conductive material film has a width sufficient to cover the surroundings and vicinity (a part of the scribe region 23) of a chip (e.g. the chip 22) in which the semiconductor element is built.

Form (2):

In addition to form (1), the conductive material film is a polysilicon film, and the conductive material film patterned by an anisotropically etching is a memory electrode for a memory capacity included in the semiconductor element.

Form (3):

In addition to form (1), the conductive material film is a polysilicon film, and the conductive material film patterned by an anisotropically etching is a fin structure memory element for a memory capacity of a memory cell comprising a single capacitor and a single transistor.

A use of any of those forms prevents a residue of the semiconductor material film from drifting around the chip, even if the base insulating film is removed after anisotropically etching a conductive material film. This solves the problem of malfunctioning caused by an attachment of the drifting residue to another part of the semiconductor memory device, thereby greatly improving the yield in manufacturing a semiconductor memory. Because only a simple change in a mask pattern for use in anisotropically etching the semiconductor material film is necessary for obtaining the result, this invention can be quite easily realized without any difficulty whatsoever. Explanation of the Concrete Embodiments

EXPLANATION OF THE CONCRETE EMBODIMENTS

Figure 26:
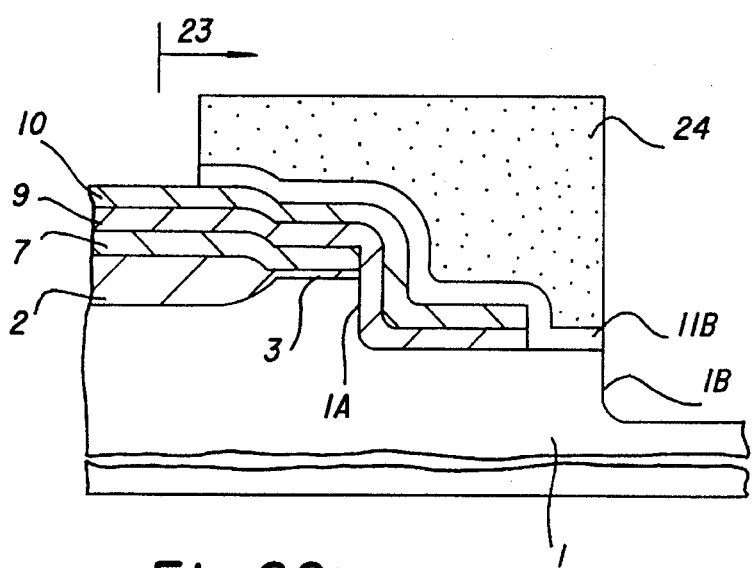
FIG. 26 shows a sectional side view of a pertinent portion of a DRAM for explaining a process of manufacturing an embodiment of the present invention.
Figure 27:
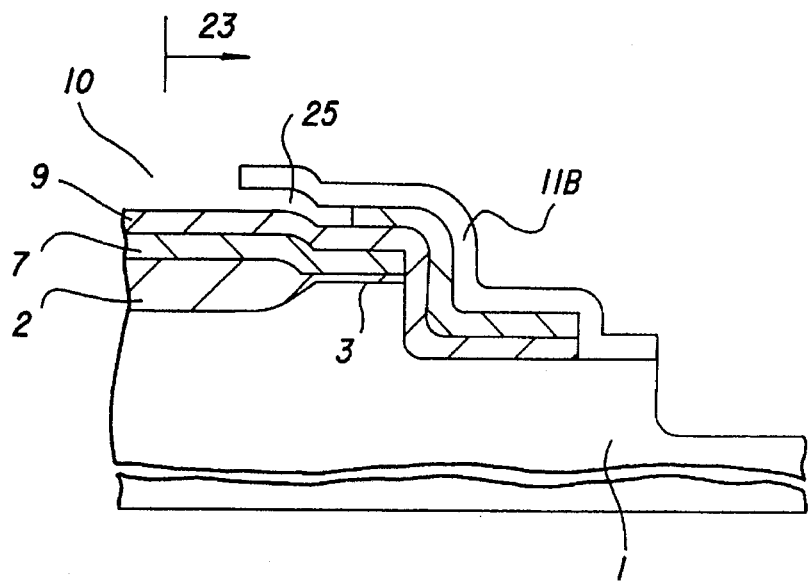
FIG. 27 shows a sectional side view of a DRAM for explaining a manufacturing process of an embodiment of the present invention.

FIGS. 26 and 27 show cutaways of a DRAM during pertinent manufacturing steps in a first embodiment of this invention.

Described below is an explanation of the first embodiment.

Parts shown in FIGS. 26 and 27 that are essentially the same as those shown in FIGS. 1 through 24 have the same numbers.

Figure 22:
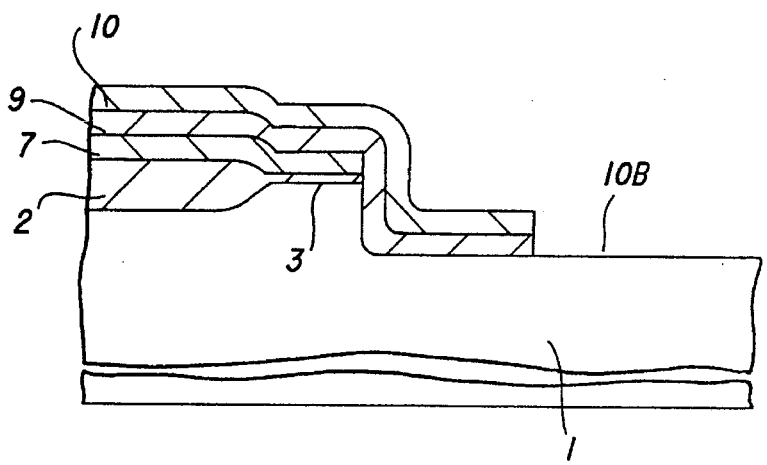
FIG. 22 shows a cutaway of a pertinent part of a DRAM for illustrating its changes in the conventional manufacturing steps.
Figure 23:
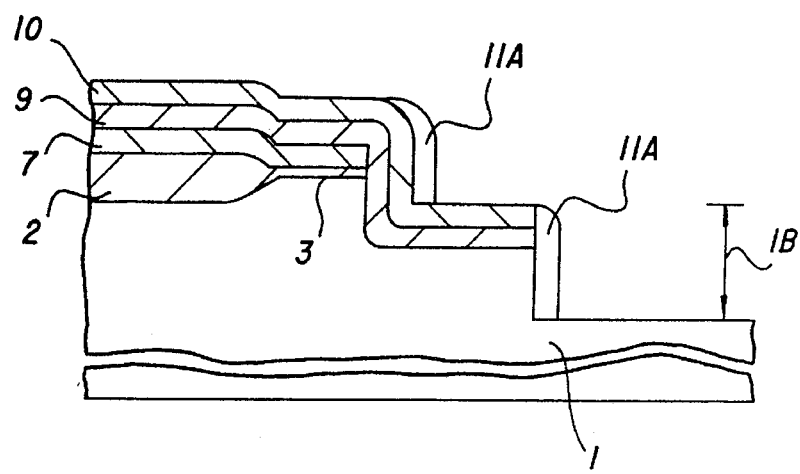
FIG. 23 shows a cutaway of a pertinent part of a DRAM for illustrating its changes in the conventional manufacturing steps.
Figure 24:
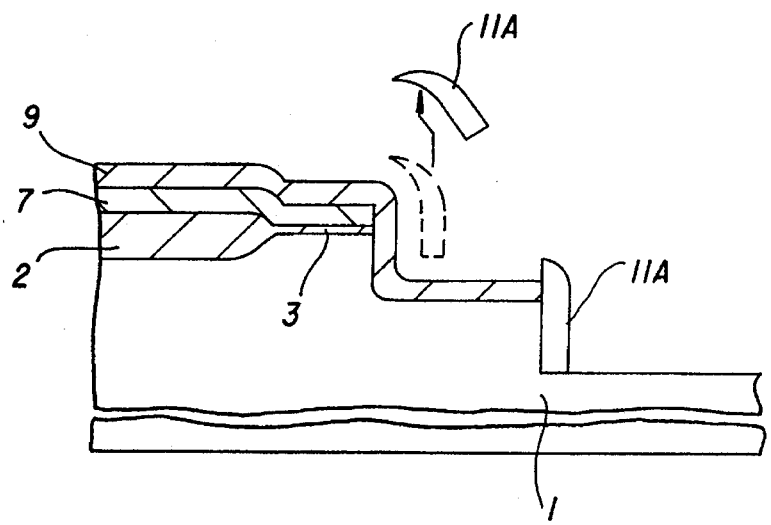
FIG. 24 shows a cutaway of a pertinent part of a DRAM for illustrating its changes in the conventional manufacturing steps.

A feature of the manufacturing process pursuant to this invention as distinguished from the earlier described prior art resides in the step of forming a memory electrode by patterning a polysilicon film. Since other steps are hardly different from those of prior art, only the procedure after completing step 22-1 explained in the description of FIG. 22 is discussed below.

In FIG. 26:
Step 26-1:
By applying CVD method, a polysilicon film, e.g. having a thickness of one hundred nanometers [100 nm], is formed. It goes without saying that the polysilicon film is for forming the memory electrode 11. (Refer to FIGS. 1 and 2.)
Step 26-2:
By applying a resist process of a lithography technique, a resist film having a memory electrode pattern is formed on the polysilicon film, which is created in step 26-1, and a belt resist film 24 is formed in the scribe region 23 to cover the surrounding area and vicinity of the chip.
Step 26-3:
By applying an RIE method using $Br_2$ as an etching gas for polysilicon and the band resist film 24 as a mask, the polysilicon film formed in step 26-1 is anisotropically etched.

This forms the memory electrode 11 made of polysilicon in the memory cell part of the chip and forms the belt cover film 11B made of polysilicon in the scribe region 23.

In FIG. 27:
Step 27-1:
By applying a wet etching method using an HF-based solvent as an etchant, the insulating film 10 made of $SiO_2$ is etched isotropically. Through this procedure, the memory cell part in a chip has the backside of the memory electrode 11 exposed. Since the width W of the band cover film 11B is sufficiently wide in the scribe region 23, only a void 25 (shown by an arrow in FIG. 27) is generated by a partial removal of the insulating film 10, and a polysilicon residue 11A is not lifted off as in prior art.
Step 27-2:
Then, by applying the procedure explained in step 10/16-3 discussed in the description of FIGS. 10 and 16, the DRAM chip is formed.

Although the first embodiment has mainly explained a DRAM chip, the scribe region 23 has a lot more patterns, such as alignment marks for a user by a stepper and patterns for various inspections, which cause a residue of a memory electrode material film to drift in the etchant.

Figure 28A:
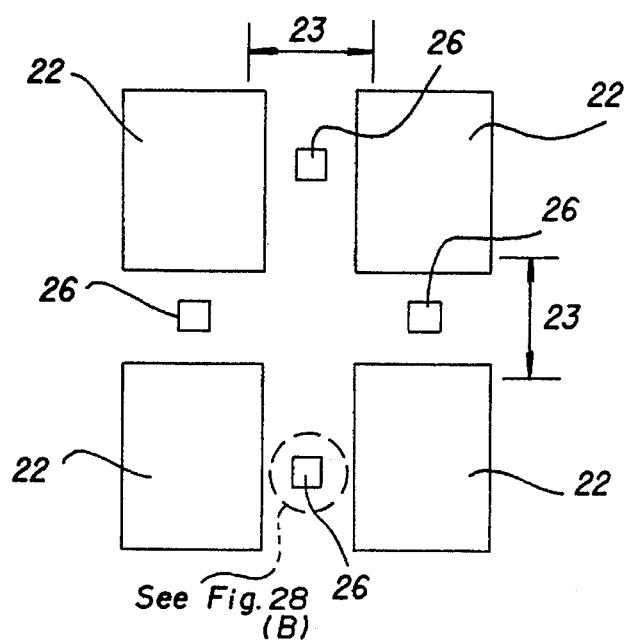
FIGS. 28(A) and 28(B) show a plan view of a pertinent portion of a wafer for explaining the case in which the present invention is applied to an alignment mark for a stepper.
Figure 28B:
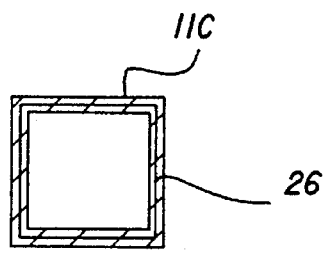

FIGS. 28(A) and 28(B) show a plan view of a pertinent part of a wafer, illustrating a second embodiment in which this invention is applied to an alignment mark for use by a stepper.

Figure 1:
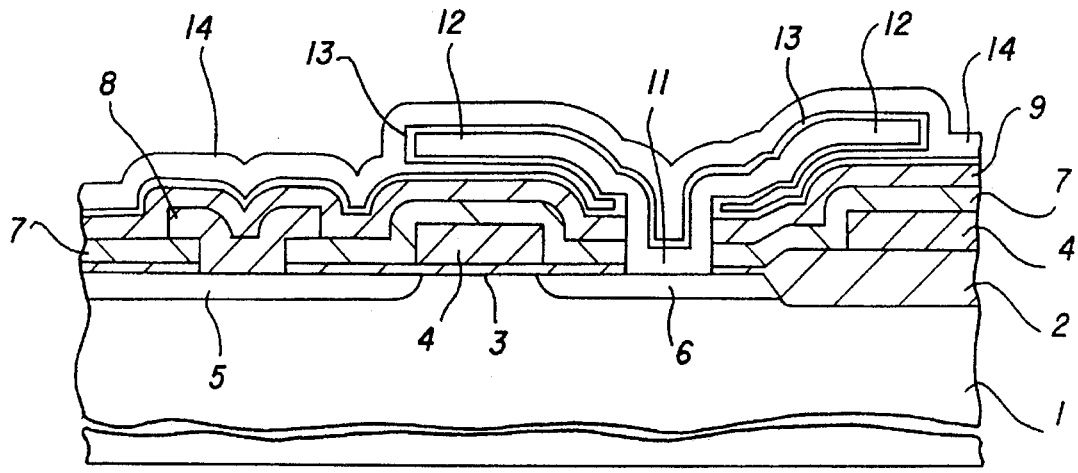
FIG. 1 is a side view showing a cutaway of a pertinent part for explaining a DRAM having a single layer fin structure storage capacitor.
Figure 2:
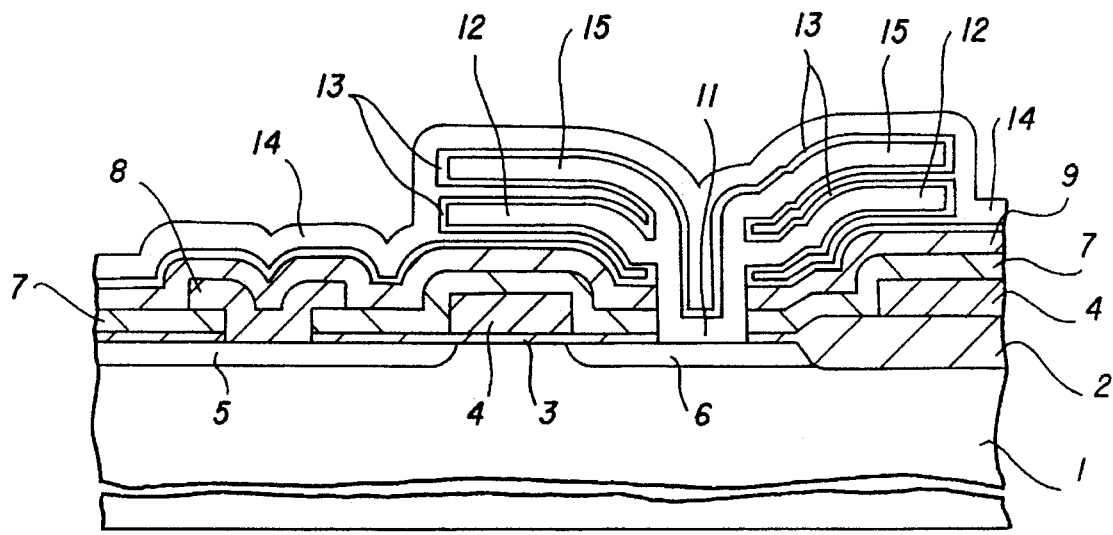
FIG. 2 is a side view showing a cutaway of a pertinent part for explaining a DRAM having a dual layer fin structure storage capacitor.
Figure 3:
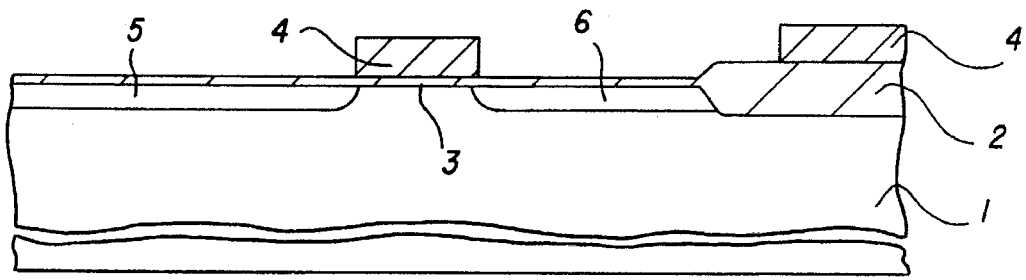
FIG. 3 is a side view of pertinent parts for explaining prior art manufacturing processes.
Figure 4:
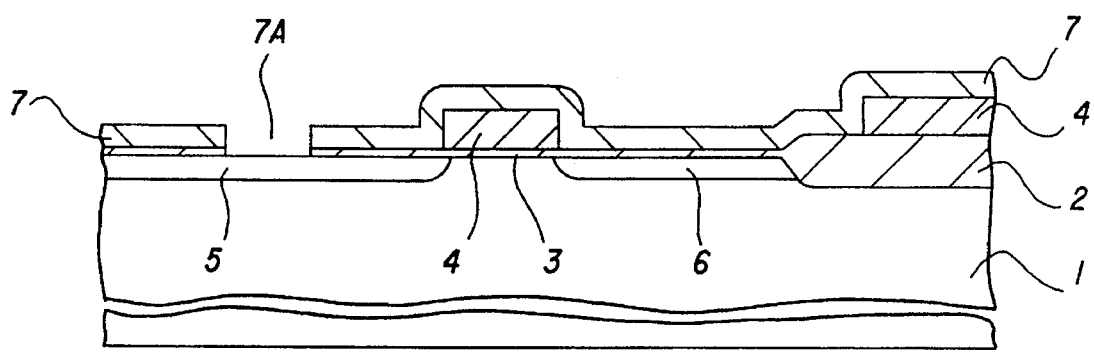
FIG. 4 is a side view of pertinent parts for explaining prior art manufacturing processes.
Figure 5:
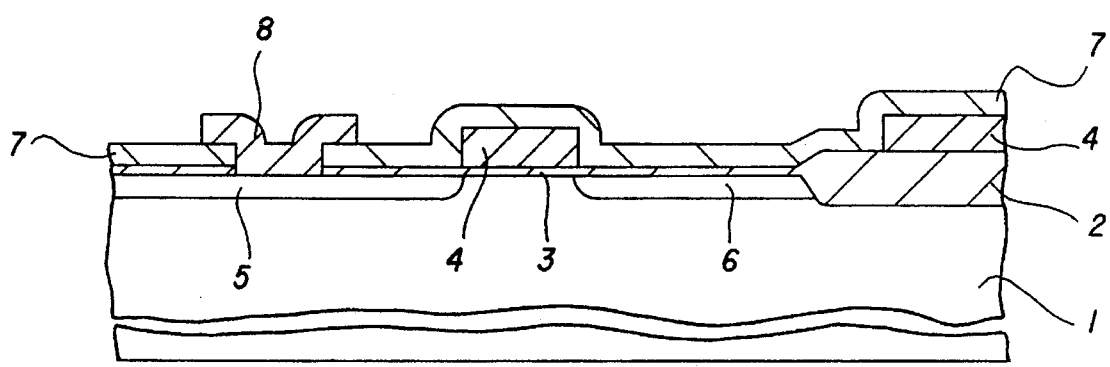
FIG. 5 is a side view of pertinent parts for explaining prior art manufacturing processes.
Figure 6:
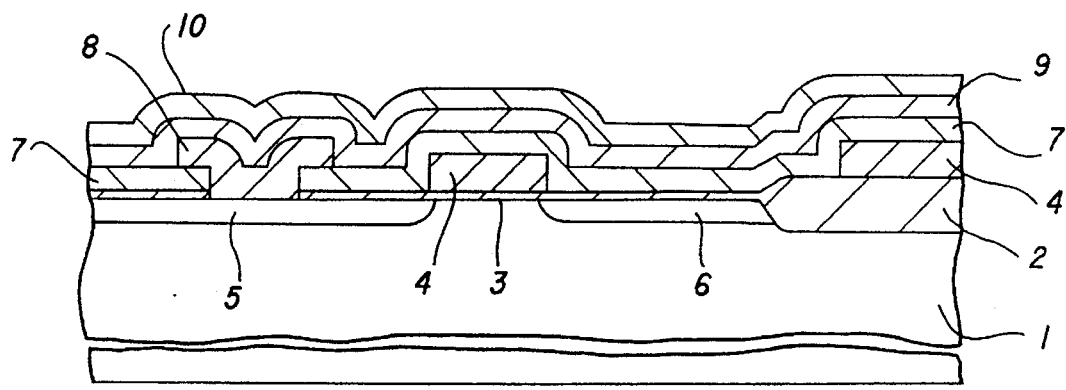
FIG. 6 is a side view of pertinent parts for explaining prior art manufacturing processes.
Figure 7:
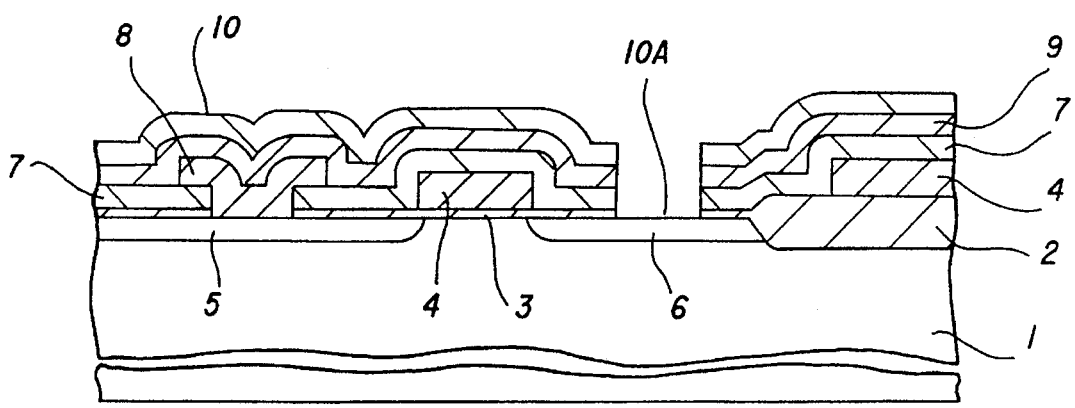
FIG. 7 is a side view of pertinent parts for explaining prior art manufacturing processes.
Figure 8:
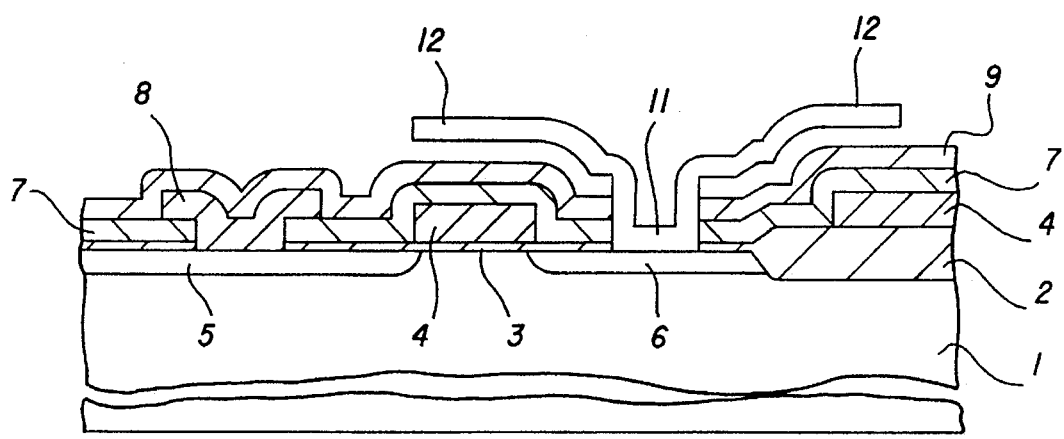
FIG. 8 is a side view of pertinent parts for explaining prior art manufacturing processes.
Figure 9:
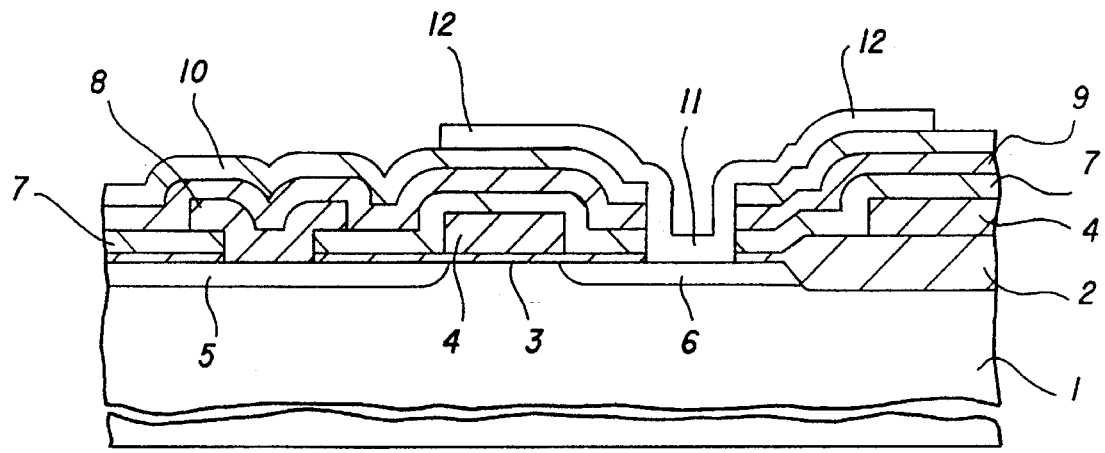
FIG. 9 is a side view of pertinent parts for explaining prior art manufacturing processes.
Figure 10:
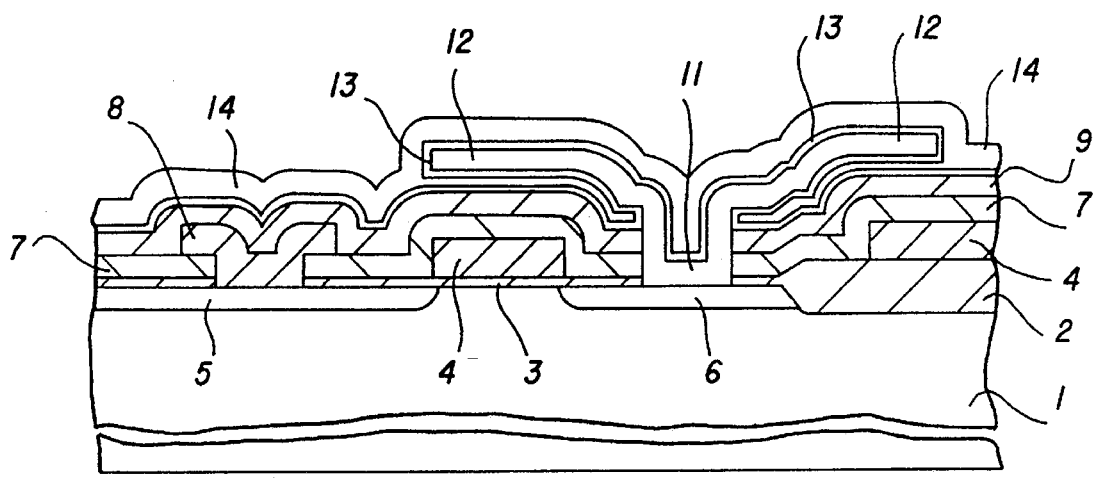
FIG. 10 is a side view of pertinent parts for explaining prior art manufacturing processes.
Figure 11:
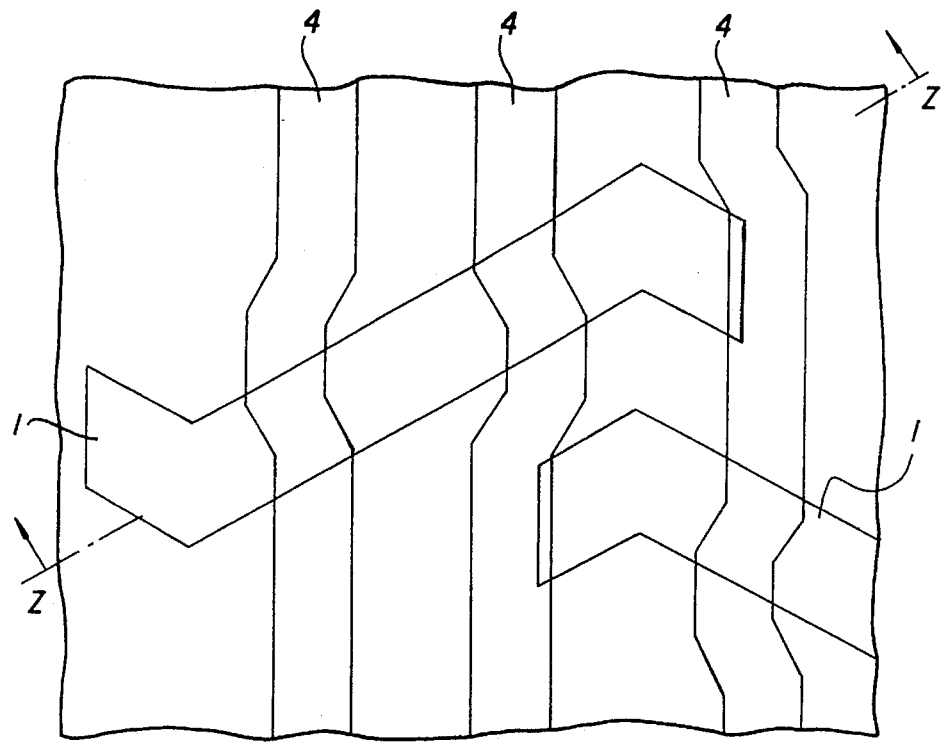
FIG. 11 is a plan view of pertinent parts for explaining prior art manufacturing processes.
Figure 12:
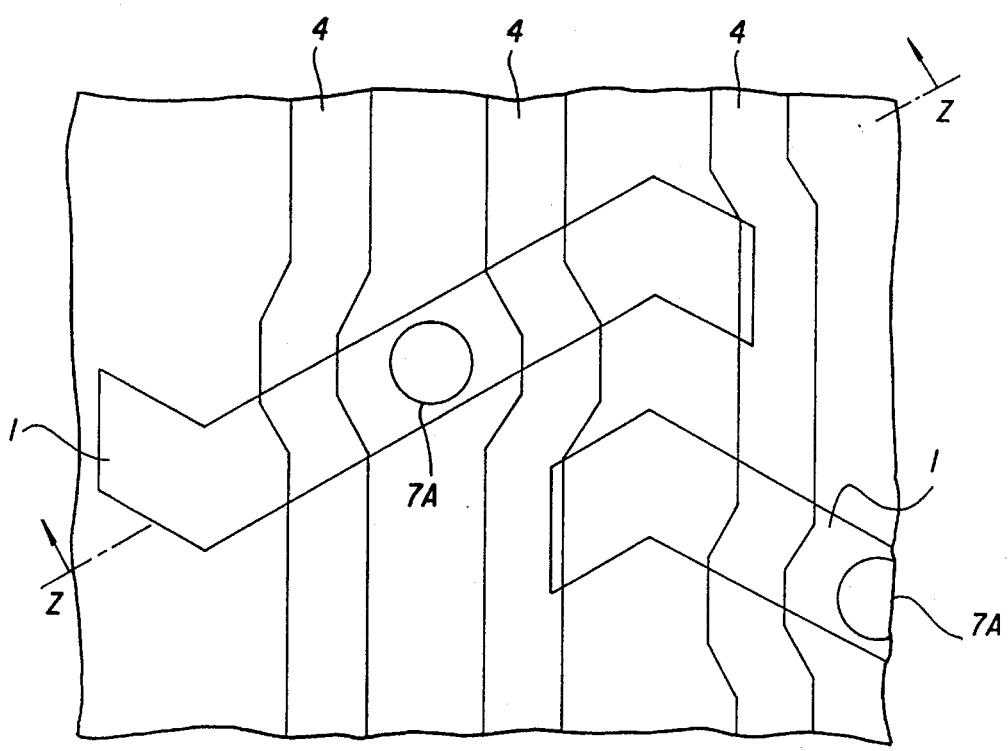
FIG. 12 is a plan view of pertinent parts for explaining prior art manufacturing processes.
Figure 13:
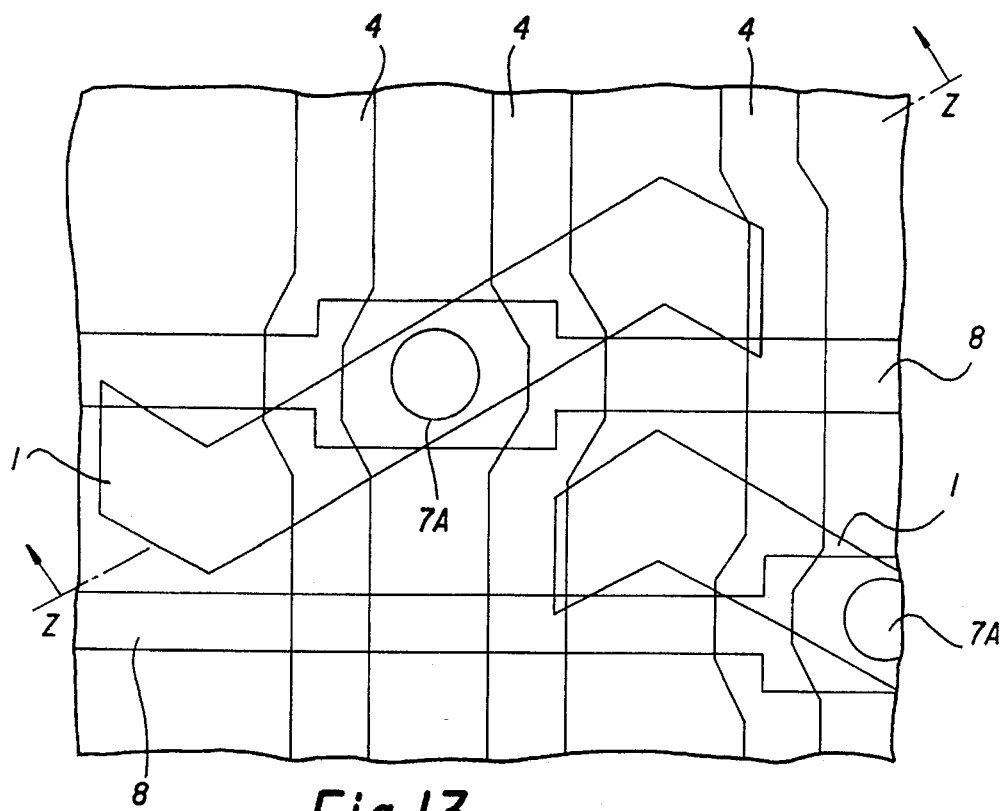
FIG. 13 is a plan view of pertinent parts for explaining prior art manufacturing processes.
Figure 14:
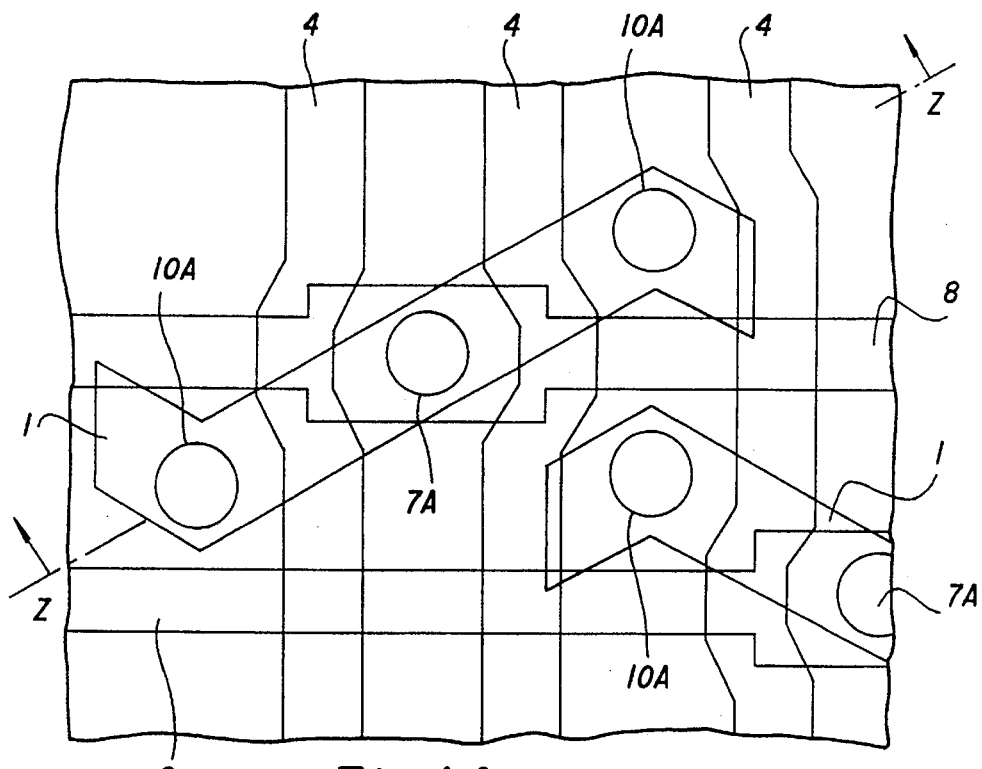
FIG. 14 is a plan view of pertinent parts for explaining prior art manufacturing processes.
Figure 15:
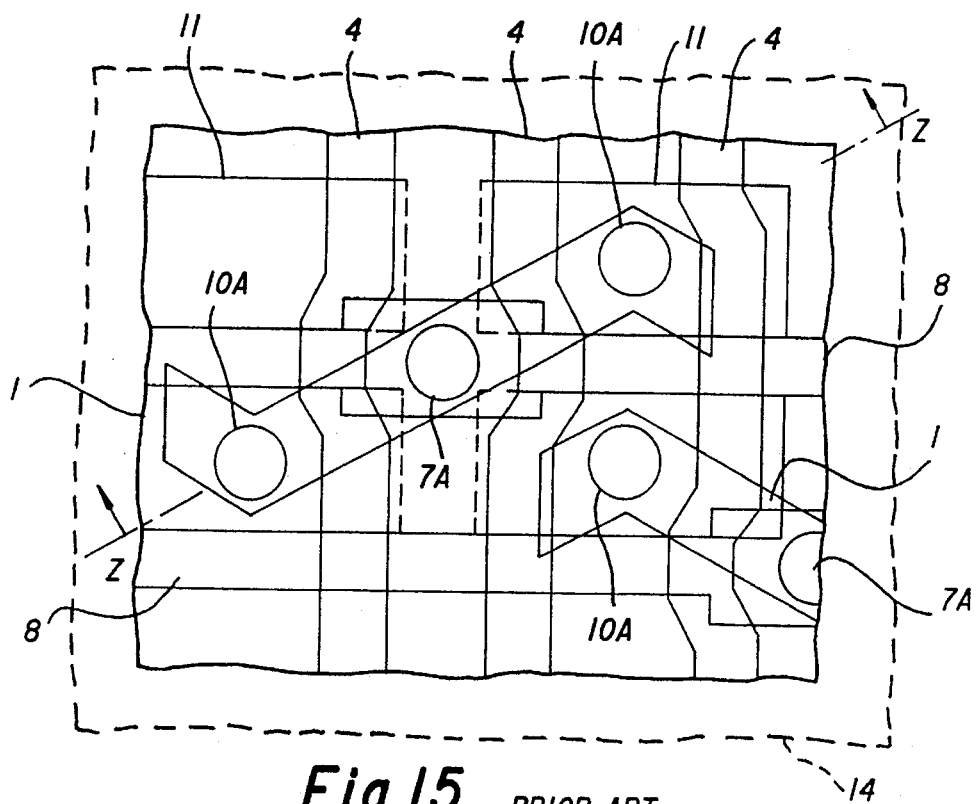
FIG. 15 is a plan view of pertinent parts for explaining prior art manufacturing processes.
Figure 16:
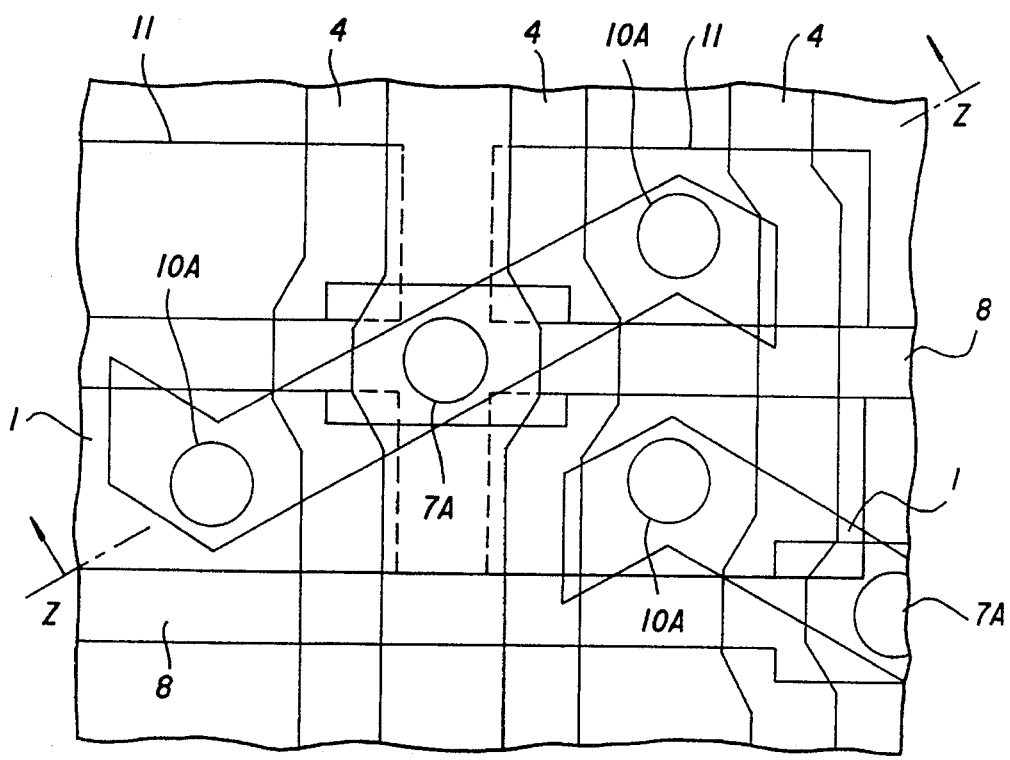
FIG. 16 is a plan view of pertinent parts for explaining prior art manufacturing processes.
Figure 17:
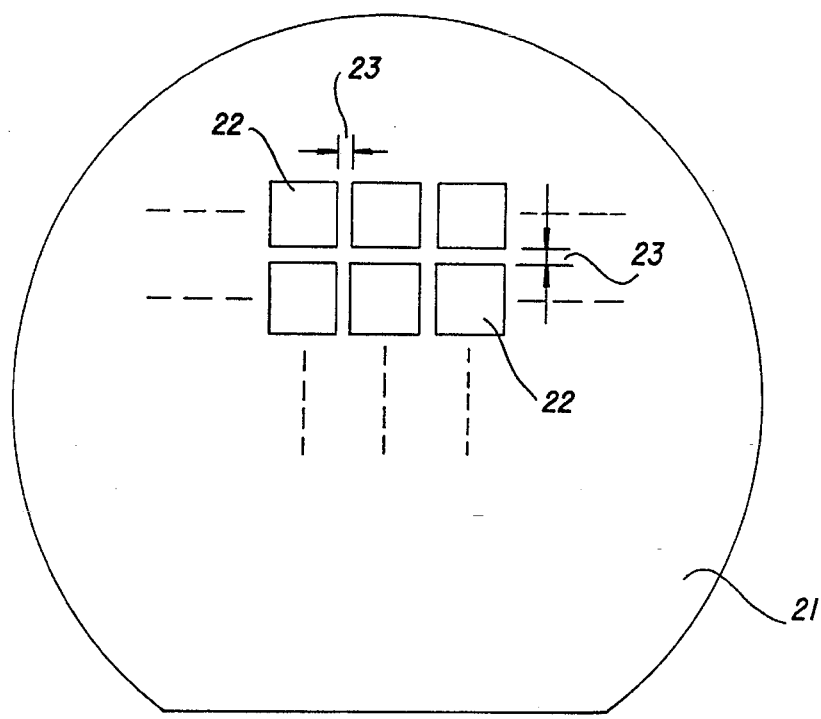
FIG. 17 shows a plan view of a pertinent part of a wafer with a chip formed in it.
Figure 18:
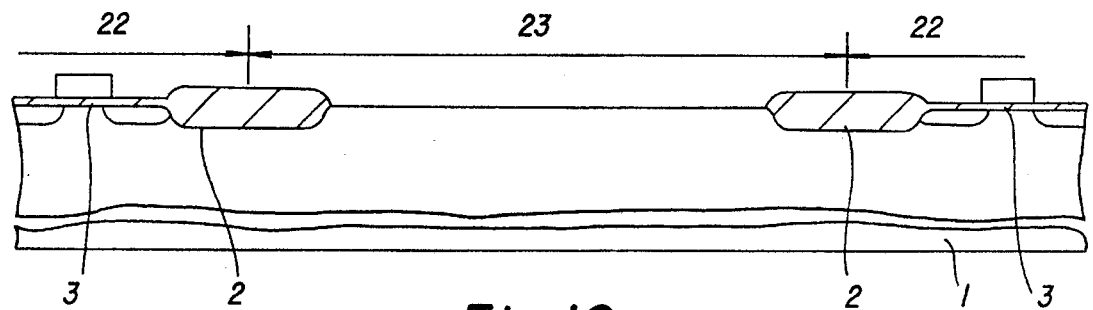
FIG. 18 shows a magnified cutaway of the pertinent part circled in dashed lines in FIG. 17.
Figure 19:
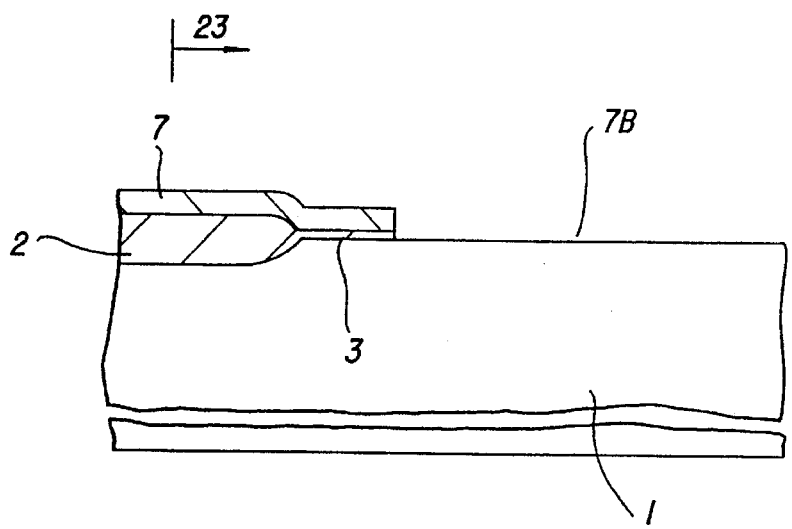
FIG. 19 shows a cutaway of a pertinent part of a DRAM for illustrating its changes in the conventional manufacturing steps.
Figure 20:
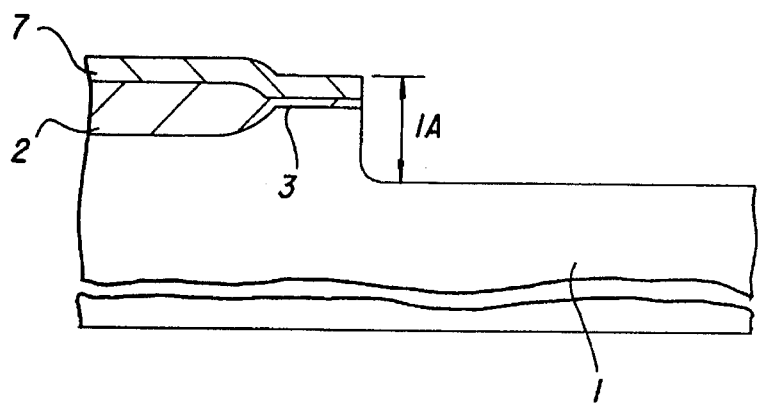
FIG. 20 shows a cutaway of a pertinent part of a DRAM for illustrating its changes in the conventional manufacturing steps.
Figure 21:
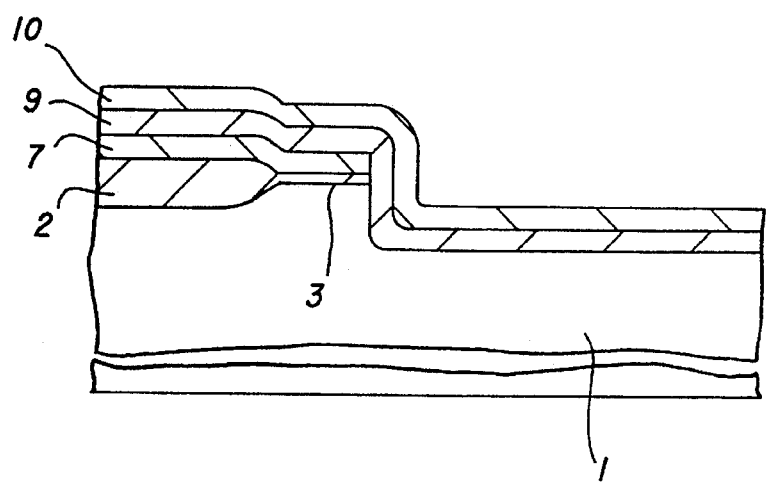
FIG. 21 shows a cutaway of a pertinent part of a DRAM for illustrating its changes in the conventional manufacturing steps.

FIGS. 28(A) and 28(B) show essentially the same parts as those shown in FIGS. 17, 26 and 27 and have the same numbers.

In FIG. 28(A) shows how each scribe region 23 carries its alignment mark 26, and FIG. 28(B) shows in detail an application of this invention to an alignment mark 26, where 11C is a belt cover film similar to the belt cover film 11B shown in FIG. 26.

It goes without saying that the second embodiment is implemented concurrently with the first embodiment for preventing a residue of a memory electrode material film from drifting around a chip by forming the belt cover film 11C in the vicinity of the alignment mark 26 upon patterning the memory electrode 11. This completely prevents a residue of a memory electrode material film formed in the vicinity of the alignment mark 26 from drifting around the chip.

Next, it will be explained that the present invention can be applied to a DRAM with a capacitor cell not having the structure of a stacked capacitor cell with a fin structure.

Figure 29A:
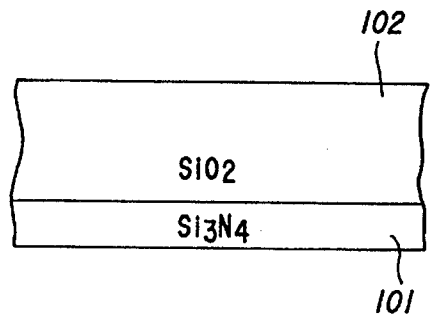
FIGS. 29A through 29F show another process of manufacturing the semiconductor device to which the present invention is applied.
Figure 29D:
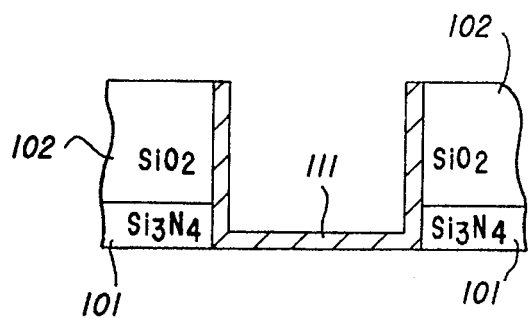
Figure 29B:
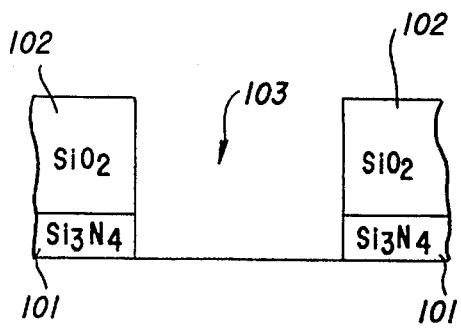
Figure 29E:
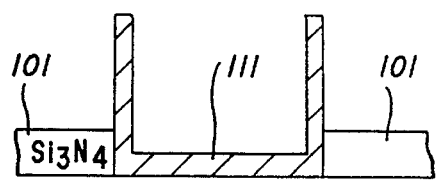
Figure 29C:
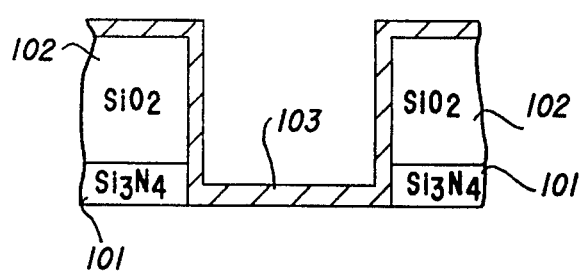
Figure 29F:
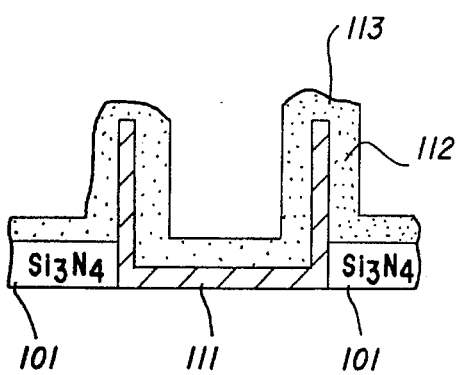

FIGS. 29A to F show a process of manufacturing a memory cell with the crown type or cylinder type storage capacitor.
Step 29-1:
First, as shown in FIG. 29A, $Si_3N_4$ film 101 and $SiO_2$ film 102 are formed by a CVD method, for example.
Step 29-2:
As shown in FIG. 29B, an anisotropical etching is performed by using the RIE method and a part of $SiO_2$ film 102 and $Si_3N_4$ film 104 are selectively deleted, thereby forming aperture 103 for forming a capacitor cell.
Step 29-3:
Sequentially, as shown in FIG. 29C, a polysilicon film 104 is deposited on a bottom and side wall of the aperture 103, and on the $SiO_2$ film 102 by using the CVD method.
Step 29-4:
As shown in FIG. 29D, a polysilicon film 104 formed on the $SiO_2$ film 102 is eliminated by the RIE method, thereby forming a storage electrode 111 by a polysilicon film.
Step 29-5:
Sequentially, as shown in FIG. 29E, the $SiO_2$ film 102 is deleted by an anisotropical etching using a wet etching method.
Step 29-6:
As shown in FIG. 29F, a capacitor film 112 comprising 2 layers of $Si_3N_4$ film and $SiO_2$ is formed by using the CVD method. Sequentially, an opposite electrode 113 comprising a polysilicon film is formed using the CVD method.

Figure 30A:
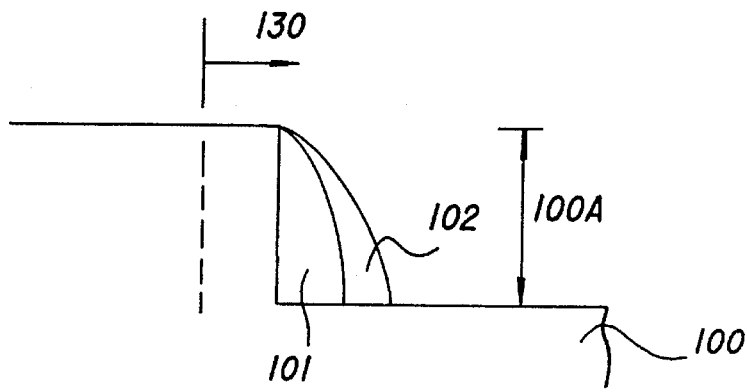
FIGS. 30(A)–30(C) explain a problem, which is caused in the process shown in FIGS. 29B, 29D and 29E.
Figure 30B:
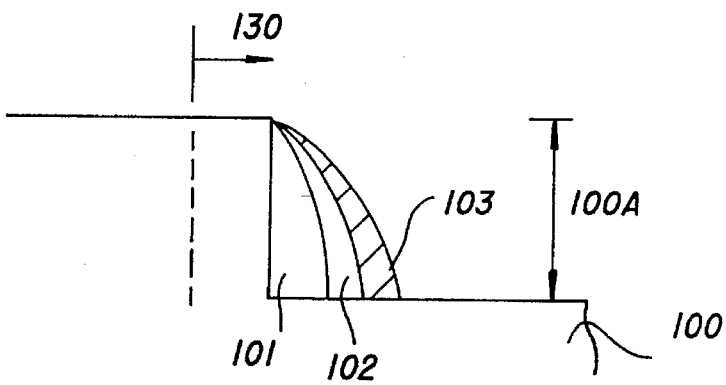
Figure 30C:
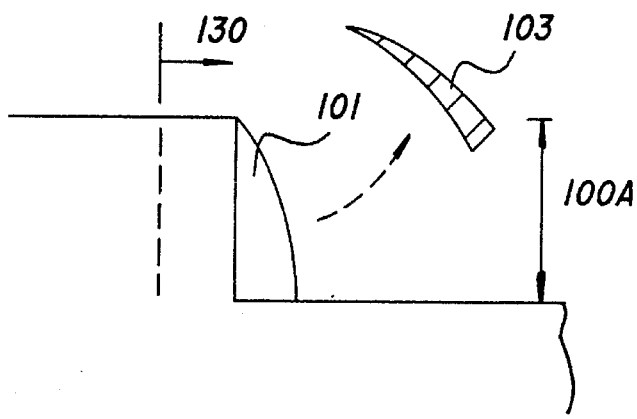

In the process shown in FIG. 29E, a residue comprising a polysilicon which remains in a scribe region result without being completely etched is lifted off and is attached to the chip. When a bit line (not shown) is formed by anisotropical etching before the process shown in FIG. 29A, the $Si_3N_4$ film 101 and $SiO_2$ film 102 which are not completely etched are attached to the side wall of the kink 100A, which is formed during a process of forming a bit line. When the step shown in FIG. 29D is performed, as shown in FIG. 30B, the polysilicon film 104 which is not etched is attached on the $SiO_2$ film 102 formed on the kink 100A of the scribe region. When the step shown in FIG. 29E is performed, as shown in FIG. 30C, the polysilicon film 104 formed on the scribed region 130 is lifted off and attached to the chip.

Accordingly, where the semiconductor device with the crown type structure or the cylinder type structure capacitor cell is formed, a belt cover comprising a predetermined width of a polysilicon film can be formed on the scribe region in the periphery or vicinity of the chip, thereby preventing the storage electrode material formed on the scribe region from being lifted off as stated in the previous embodiment.

In the above embodiment, RIE (Reactive Ion Etching) is used as anisotropical etching. ECR (Electron Cyclotron Reasonce), magnetron method, or a high frequency induction method is also used for the etching.

The present invention is applied to other semiconductor devices in which SRAM or EEPROM is formed than the semiconductor device in which DRAM is formed.

As is described above, a semiconductor element is manufactured, such that a conductive material film is etched anisotropically to form a pattern and a base insulating film is etched isotropically, thereby exposing the backside of the conductive material film. A belt cover film formed by using a part of the conductive material film has a width sufficient to cover the surrounding area and vicinity of the chip in which the semiconductor element is built.

The configuration totally prevents a residue of a semiconductor material film from drifting around the chip, even if the base insulating film is removed after the conductive material film is anisotropically etched. As a result, malfunctions caused by the residues attaching to other parts of a semiconductor device are solved, thereby significantly improving the yield in manufacturing. Also, because a mere change in a mask pattern for use in an anisotropic etching will allow this invention to be embodied, this invention can be put into practical use quite easily without any difficulty whatsoever.

A semiconductor element is also manufactured, such that a conducted material film for providing a storage electrode of a capacitor is formed on a semiconductor film and, the conductive material film is patterned by an anisotropical etching thereby forming the storage electrode, and the periphery and vicinity of the chip in which the storage capacitor is formed is covered by the same conductive material film as that of the storage electrode Thereafter the insulating film is eliminated by an isotropical etching.

Therefore, when the insulating film is eliminated by the isotropical etching, the residue of the conductive material film remaining in the periphery and the vicinity of the chip without being eliminated by the isotropical etching is prevented from being lifted off, thereby achieving the same effect as the above embodiments.

What is claimed is:

1. A method of manufacturing a semiconductor device comprising the steps of:

forming an insulating film on a chip in which a semiconductor device is formed;

forming a) a conductive material film on the insulating film and b) a dispersion preventing means for preventing etching residue from dispersing during isotropical etching, said dispersion preventing means is formed as part of said conductive material film, said dispersion preventing means to cover a periphery of said chip in which said semiconductor device is formed;

anisotropically etching the conductive material film formed on the insulating film for creating a pattern; and exposing an underside of the conductive material film by isotropically etching the insulating film.

2. The method of manufacturing the semiconductor device manufacturing method according to claim 1, wherein:

said conductive material film comprises a polysilicon film; and said conductive material film patterned by an anisotropical etching forms a storage electrode for a storage capacitor included in said semiconductor device.

3. The semiconductor device manufacturing method according to claim 1, wherein:

said conductive material film comprises a polysilicon film; and said conductive material film patterned by an anisotropical etching forms a fin structure memory element for a storage capacitor of a memory cell comprising a single capacitor and a single transistor.

4. The semiconductor device manufacturing method according to claim 1 wherein said insulating film comprises a $SiO_2$ film.

5. A method of manufacturing a semiconductor device comprising the steps of:

forming an insulating film on a chip in which a semiconductor device is formed;

forming a) a conductive material film on the insulating film and b) a dispersion preventing means for preventing etching residue from dispersing during isotropical etching, said dispersion preventing means is formed as part of said conductive material film, said dispersion preventing means to cover a periphery of said chip in which said semiconductor device is formed;

processing the conductive material film formed on the insulating film for creating a pattern; and exposing a side of the conductive material film by isotropically etching the insulating film, the side of the conductive film being in contact With the insulating film.

6. The method of manufacturing the semiconductor device according to claim 5 wherein said conductive material film comprises a storage electrode of a cylindrical stacked capacitor cell.

7. The method of manufacturing the semiconductor device according to claim 5 wherein said storage electrode comprises polysilicon.

* * * * *